(12) United States Patent
Onami et al.

(10) Patent No.: US 6,733,695 B2
(45) Date of Patent: May 11, 2004

(54) ELECTRICALLY CONDUCTIVE PASTE AND SEMICONDUCTOR DEVICE PREPARED BY USING THE PASTE

(75) Inventors: Kazuto Onami, Utsunomiya (JP); Toshiro Takeda, Utsunomiya (JP); Akira Fukuizumi, Tokyo (JP); Yoshihiro Nakajima, Tokyo (JP)

(73) Assignee: Sumitomo Bakelite Company Ltd., Tokyo (JP)

(*) Notice: Subject to any disclaimer, the term of this patent is extended or adjusted under 35 U.S.C. 154(b) by 117 days.

(21) Appl. No.: 10/176,377

(22) Filed: Jun. 21, 2002

(65) Prior Publication Data
US 2003/0122257 A1 Jul. 3, 2003

(30) Foreign Application Priority Data

Jun. 28, 2001 (JP) .................................... 2001-197147

(51) Int. Cl.$^7$ ................................................ H01B 1/22
(52) U.S. Cl. ...................... 252/514; 106/1.19; 29/854
(58) Field of Search .................... 252/514; 106/1.19; 29/854

(56) References Cited

U.S. PATENT DOCUMENTS 6,406,646 B1 * 6/2002 Lee et al. .................... 252/514

FOREIGN PATENT DOCUMENTS

| JP | 09-282941 | * 10/1997 |
| JP | 11-185528 | * 7/1999 |

* cited by examiner

Primary Examiner—Mark Kopec
(74) Attorney, Agent, or Firm—Smith, Gambrell & Russell, LLP

(57) ABSTRACT

An electrically conductive paste comprises 80% by weight or more of silver powder and 20% by weight or less of a thermosetting resin. The silver powder has a particle size distribution having two peaks at specific positions. Viscosities of the paste measured under a low shearing stress and under a high shearing stress are in respective specific ranges and the ratio of these viscosities is in a specific range. A cured product obtained by heating the paste has a tensile modulus in a specific range. The paste has thermal and electric conductivities approximately the same as those of solder, shows little change in properties under a high temperature and a high humidity or under cyclic cooling and heating, exhibits excellent workability in coating and can be applied to coating by using nozzles having a wide range of diameters. A reliable semiconductor device is prepared by using the paste.

11 Claims, No Drawings

ELECTRICALLY CONDUCTIVE PASTE AND SEMICONDUCTOR DEVICE PREPARED BY USING THE PASTE

BACKGROUND OF THE INVENTION

1. Field of the Invention

The present invention relates to an electrically conductive paste and a semiconductor device prepared by using the paste. More particularly, the present invention relates to a highly reliable electrically conductive paste which is used for adhesion of semiconductive elements such as IC and LSI to metal frames and for electrically conductive bonding of semiconductive elements with outer electrodes and to a semiconductor device prepared by using the paste.

2. Description of Related Art

As the electronics industry has made the remarkable progress, semiconductor elements have achieved the developments from transistors to IC, from IC to LSI and from LSI to super LSI. The degree of integration in the semiconductor elements has rapidly increased and the mass production of the elements has been made possible. As the application of the semiconductor products using the semiconductor elements expands, improvement in workability and reduction of cost have become important subjects in the mass production. On the other hand, bonding of semiconductor elements with metal frames and outer electrodes has been conducted by using solder containing lead, which is harmful to the human health. However, from the standpoint of protection of the global environment, it is required that the bonding be conducted by using other electrically conductive materials which do not contain lead. Heretofore, in general, a semiconductor element is bonded to an electrically conductive member such as a frame in accordance with the Au—Si cocrystallization method and the bonded portion is sealed with a hermetic seal to produce a semiconductor product. However, a sealing method with a resin has been developed to improve workability and reduce cost in the mass production and is widely used at present. As an improved method for the Au—Si cocrystallization method in the mounting step, a method using a resin paste, i.e., a method using an electrically conductive paste, is used. Moreover, as the semiconductor devices have higher densities and greater capacities, it is required that the resin paste itself have electric and thermal conductivities as excellent as those of conventional solder metals. In particular, in a power MOSFET, resistance in the condition that a switch is put on must be lowered as much as possible so that generated heat at the surface of the element is removed and the function of the switch is enhanced. Therefore, bonding to outer electrodes with a metal plate is studied as a method to replace the wire bonding.

For further improving the reliability of semiconductor elements, it is recently required that the reliability of bonding of semiconductor elements be not adversely affected even when a resin package is exposed to a high temperature and a high humidity or to cyclic cooling and heating.

As the electrically conductive paste having the required excellent reliability, a paste prepared by dissolving a thermoplastic resin in a solvent and adding a great amount of a metal filler such as silver powder to the dissolved resin is studied. However, when an excessively great amount of the metal filler is added to surely obtain the high electric and thermal conductivities, drawbacks arise in that viscosity increases to deteriorate workability and that an organic solvent added to decrease the viscosity is scattered during heating to cause formation of voids, a decrease in the thermal conductivity and an increase in the electric resistance in the bonding portion.

In general, the electrically conductive paste is applied to coat the bonding portion in accordance with a method such as dispense, printing and stamping and used after being cured by heating. It is preferable that the paste exhibits excellent workability in coating independently of the area of the portion to be coated. Recently, as the degree of integration of semiconductor elements increases, coating a portion having a smaller area is required. As the result, it is required that the coating can be conducted by using a smaller nozzle. For example, when the coating is conducted using a conventional electrically conductive paste, nozzles having a diameter of 0.3 mm or greater can be used but nozzles having a diameter smaller than 0.3 mm cause a problem in that clogging of the nozzles takes place due to contact between filler particles and a uniform coating cannot be achieved. It is required recently that the coating be conducted using a nozzle having a diameter of 0.1 mm. Moreover, it is also required that the paste which can be used for coating by a nozzle having a small diameter can be used also for coating by a nozzle having a great diameter.

As shown in Japanese Patent Application Laid-Open No. 2000-114445, a metal plate of a lead frame and the surface of a die are bonded with an electrically conductive paste to enhance the switching function of a power MOSFET. However, when a conventional epoxy resin-based paste or a conventional polyimide-based paste is used, drawbacks arise in that the electric and thermal conductivities are insufficient and that the resistance in the condition that a switch is put on increases when the product is exposed to a high temperature and a high humidity such as the condition in the pressure cooker test or to cyclic cooling and heating although satisfactory results can be obtained under the initial condition. It is desired that that above drawbacks are overcome. In Japanese Patent Application Laid-Open No. 2000-223634, a bonding method using a gold bump is disclosed. However, this method is disadvantageous from the standpoint of cost.

SUMMARY OF THE INVENTION

The present invention has an object of providing an electrically conductive paste which has thermal and electric conductivities approximately the same as those of solder, shows little change in properties under a high temperature and a high humidity or under cyclic cooling and heating, exhibits excellent workability in coating and can be applied by using nozzles having a wide range of diameters and a semiconductor device prepared by using the paste.

As the result of the extensive studies by the present inventor to achieve the above object, it was found that, when an electrically conductive paste comprised 80% by weight or more of silver powder and 20% by weight or less of a thermosetting resin, the silver powder had a particle size distribution having two peaks at specific positions, viscosities of the paste measured under a low shearing stress and under a high shearing stress were in respective specific ranges, the ratio of these viscosities was in a specific range and a cured product obtained by heating the paste had a tensile modulus of 0.1 to 2.5 GPa, the paste had thermal and electric conductivities approximately the same as those of solder, showed little change in properties under a high temperature and a high humidity or under cyclic cooling and heating, exhibited excellent workability in coating and could be applied to coating by using nozzles having a wide range of diameters. The present invention has been completed based on this knowledge.

The present invention provides:

(1) An electrically conductive paste which comprises (A) silver powder and (B) a thermosetting resin, wherein a content of the silver powder in the paste is 80% by weight or more, a particle size distribution of the silver powder measured by an apparatus for measuring a particle size distribution by laser diffraction has one peak between 0.5 to 2 μm and another peak between 2 to 10 μm, viscosity of the paste measured by an E-type viscometer is 35 to 135 Pa·s at 25° C. at a rotation speed of 0.5 rpm and 10 to 30 Pa·s at 25° C. at a rotation speed of 2.5 rpm, a quotient obtained by dividing the viscosity at 25° C. at a rotation speed of 0.5 rpm by the viscosity at 25° C. at a rotation speed of 2.5 rpm is 3.5 to 4.5, and a cured product obtained by heating the paste has a tensile modulus of 0.1 to 2.5 GPa at 25° C.;

(2) A paste described in (1), wherein the particle size distribution of the silver powder is:

| | |
|---|---|
| particles smaller than 0.5 μm: | 8 to 12% by weight |
| 0.5 to 1.0 μm: | 24 to 28% by weight |
| 1.0 to 2.0 μm: | 20 to 24% by weight |
| 2.0 to 4.0 μm: | 9 to 13% by weight |
| 4.0 to 7.0 μm: | 10 to 14% by weight |
| 7.0 to 10 μm: | 9 to 13% by weight |
| 10 to 15 μm: | 2 to 6% by weight |
| 15 to 20 μm: | 1 to 4% by weight |
| 20 μm or larger: | 0 to 2% by weight; |

(3) A paste described in (1), wherein the thermosetting resin is at least one resin selected from epoxy resins which are liquid at 25° C., acrylate compounds having an unsaturated double bond and methacrylate compounds having an unsaturated double bond;

(4) A paste described in (1), wherein an amount of chloride ions extracted from the cured product with pure water at 120° C. under 213 kPa for 5 hours is 50 μg or less per 1 g of the cured product;

(5) A paste described in (1), wherein a gel time of the thermosetting resin at 170° C. is 60 seconds or shorter; and (6) A semiconductor apparatus prepared by using an electrically conductive paste described in any one of (1) to (5).

DESCRIPTION OF THE PREFERRED EMBODIMENTS

The electrically conductive paste of the present invention is an electrically conductive paste comprising (A) silver powder and (B) a thermosetting resin. The content of the silver powder in the paste is 80% by weight or more. The particle size distribution of the silver powder measured by an apparatus for measuring a particle size distribution by laser diffraction has one peak between 0.5 to 2 μm and another peak between 2 to 10 μm. The viscosity of the paste measured by an E-type viscometer is 35 to 135 Pa·s at 25° C. at a rotation speed of 0.5 rpm and 10 to 30 Pa·s at 25° C. at a rotation speed of 2.5 rpm and the quotient obtained by dividing the viscosity at 25° C. at a rotation speed of 0.5 rpm by the viscosity at 25° C. at a rotation speed of 2.5 rpm is 3.5 to 4.5. The cured product obtained by heating the paste has a tensile modulus of 0.1 to 2.5 GPa at 25° C.

When the content of the silver paste in the electrically conductive paste is less than 80% by weight, there is the possibility that the thermal conductivity and the electric conductivity decrease.

The silver powder used in the present invention has the particle size distribution measured by an apparatus for measuring a particle size distribution by laser diffraction having one peak between 0.5 to 2 μm and another peak between 2 to 10 μm. Since the particle size distribution of the silver powder has one peak between 0.5 to 2 μm and another peak between 2 to 10 μm, an excellent dispensing property can be exhibited even when the electrically conductive paste has a content of the silver powder of 80% by weight or more. The electrically conductive paste can be applied to forming dots with stability without clogging or fluid overflow using dispensers having nozzles having a wide range of diameters. It is preferable that the peak between 0.5 to 2 μm is sharp and the peak between 2 to 10 μm is broad in the particle size distribution. It is more preferable that the peak between 0.5 to 2 μm is higher than the peak between 2 to 10 μm.

It is preferable that the particle size distribution of the silver powder used in the present invention is:

| | |
|---|---|
| particles smaller than 0.5 μm: | 8 to 12% by weight |
| 0.5 to 1.0 μm: | 24 to 28% by weight |
| 1.0 to 2.0 μm: | 20 to 24% by weight |
| 2.0 to 4.0 μm: | 9 to 13% by weight |
| 4.0 to 7.0 μm: | 10 to 14% by weight |
| 7.0 to 10 μm: | 9 to 13% by weight |
| 10 to 15 μm: | 2 to 6% by weight |
| 15 to 20 μm: | 1 to 4% by weight |
| 20 μm or larger: | 0 to 2% by weight. |

By using the silver powder having the above particle size distribution, the increase in viscosity of the electrically conductive paste is suppressed and the electrically conductive paste having a stable dispensing property can be obtained. The paste can be applied by using nozzles ranging from a very small nozzle having an inner diameter of 0.1 mm to a very large nozzle having an inner diameter of 1 mm even when the electrically conductive paste has a content of the silver powder of 80% by weight or more. The reason why the excellent dispensing property can be exhibited when the silver paste having the above particle size distribution is used is not clear. It is estimated that particles of the silver powder form a closest packing structure and, at the same time, an increase in viscosity of the electrically conductive paste is suppressed.

In the electrically conductive paste of the present invention, the thermosetting resin is not particularly limited. It is preferable that the thermosetting resin is at least one resin selected from epoxy resins which are liquid at 25° C., acrylate compounds having an unsaturated double bond and/or methacrylate compounds having an unsaturated double bond. Examples of the epoxy resin used in the present invention include polyglycidyl ethers obtained by reacting bisphenol A, bisphenol F, phenol novolak or cresol novolak with epichlorohydrin; aliphatic epoxy compounds such as butanediol diglycidyl ether and neopentyl glycol diglycidyl ether; heterocyclic epoxy compounds such as diglycidyl hidantoin; and alicyclic epoxy compounds such as vinylcyclohexene dioxide, dicyclopentadiene dioxide and alicyclic diepoxy adipate. The epoxy resin may be used singly or in combination of two or more. An epoxy resins which is solid at 25° C. can be used as the epoxy resin which is liquid at 25° C. when such an epoxy resin is mixed with a liquid resin.

The curing agent of the epoxy resin used in the present invention is not particularly limited. Examples of the curing agent include carboxylic acid dihydrazides such as adipic acid dihydrazide, dodecanoic acid dihydrazide, isophthalic acid dihydrazide and p-oxybenzoic acid dihydrazide; dicyandiamide; phenol novolak resins obtained by reacting bisphenol A, bisphenol F, bisphenol S, tetramethylbisphenol A, tetramethylbisphenol F, tetramethylbisphenol S, dihydroxydiphenyl ether, dihydroxybenzophenone, catechol, resorcinol, hydroquinone, biphenol, tetramethylbiphenol, ethylidenebisphenol, methylethylidenebis(methyl)phenol, cyclohexylidenebisphenol and monohydric phenols such as phenol, cresol and xylenol with formaldehyde in a dilute aqueous solution in the strongly acidic condition; early condensates of monohydric phenols with polyfunctional aldehydes such as acrolein and glyoxal in the acidic condition; early condensates of polyhydric phenols such as catechol, resorcinol and hydroquinone with formaldehyde in the acidic condition; imidazoles such as 2-methylimidazole, 2-ethylimidazole, 2-phenylimidazole, 2-phenyl-4-methylimidazole, 2-phenyl-4-methyl-5-hydroxymethylimidazole, 2-phenyl-4,5-dihydroxymethylimidazole and 2-undecylimidazole; and 2,4-diamino-6-{2-methylimidazole-(1)}-ethyl-s-triazines which are obtained by adding triazine and isocyanuric acid to the imidazoles to provide storage stability and addition products of isocyanuric acid to these compounds. The curing agent may be used singly or in combination of two or more.

The acrylate compound having an unsaturated double bond and the methacrylate compound having an unsaturated double bond which are used in the present invention are not particularly limited. Examples of the compound include alicyclic esters of (meth)acrylic acid, aliphatic esters of (meth)acrylic acid, aromatic esters of (meth)acrylic acid, esters of aliphatic dicarboxylic acids and (meth)acrylic acid and esters of aromatic dicarboxylic acids and (meth)acrylic acid.

A radical polymerization initiator for the acrylate compound having an unsaturated double bond and the methacrylate compound having an unsaturated double bond which are used in the present invention is not particularly limited. Examples of the radical polymerization initiator include methyl ethyl ketone peroxide, methylcyclohexanone peroxide, methyl acetoacetate peroxide, acetylacetone peroxide, 1,1-bis(t-butylperoxy)-3,3,5-trimethlcyclohexane, 1,1-bis(t-hexylperoxy)-cyclohexane, 1,1-bis(t-hexylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclododecane, n-butyl-4,4-bis(t-butylperoxy)valerate, 2,2-bis(t-butylperoxy)bytane, 1,1-bis(t-butylperoxy)-2-methylcyclohexane, t-butyl hydroperoxide, p-menthane hydroperoxide, 1,3,3-tetramethylbutyl hydroperoxide, t-hexyl hydroperoxide, dicumyl peroxide, 2,5-dimethyl-2,5-bis(t-butylperoxy)hexane, α,α'-bis(t-butylperoxy) diisopropylbenzene, t-butylcumyl peroxide, di-t-butyl peroxide, 2,5-dimethyl-2,5-bis(t-butylperoxy)hexyne-3, isobutyryl peroxide, 3,5,5-trimethylhexanoyl peroxide, octanoyl peroxide, lauroyl peroxide, cinnamoyl peroxide, m-toluoyl peroxide, benzoyl peroxide, diisopropyl peroxydicarbonate, bis(4-t-butylcyclohexyl) peroxydicarbonate, di-3-methoxybutyl peroxydicarbonate, di-2-ethylhexyl peroxydicarbonate, di-sec-butyl peroxydicarbonate, di(3-methyl-3-methoxybutyl)peroxydicarbonate, α,α'-bis(neodecanoylperoxy) diisopropylbenzene, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 2,5-dimethyl-2,5-bis (2-ethylhexanoylperoxy)hexane, 1,1,3,3-tetramethyl-butyl peroxy-2-ethylhexanoate, 1-cyclohexyl-1-methylethyl peroxy-2-ethylhexanoate, t-hexyl peroxy-2-ethylhexanoate, t-butyl peroxy-2-ethylhexanoate, t-butyl peroxyisobutyrate, t-butyl peroxymaleic acid, t-butyl peroxylaurate, t-butyl peroxy-3,5,5-trimethylhexanoate, t-butylperoxyisopropyl monocarbonate, t-butylperoxy-2-ethylhexyl monocarbonate, 2,5-dimethyl-2,5-bis(benzoylperoxy) hexane, t-butyl peroxyacetate, t-hexyl peroxybenzoate, t-butyl peroxy-m-toluoylbenzoate, t-butyl peroxybenzoate, bis(t-butylperoxy) isophthalate, t-butylperoxyallyl monocarbonate and 3,3',4,4'-tetra(t-butylperoxycarbonyl) benzophenone. The radical polymerization initiator may be used singly or in combination of two or more.

The electrically conductive paste of the present invention has a viscosity measured by an E-type viscometer of 35 to 135 Pa·s and preferably 50 to 110 Pa·s at 25° C. at a rotation speed of 0.5 rpm and 10 to 30 Pa·s and preferably 15 to 25 Pa·s at 25° C. at a rotation speed of 2.5 rpm and a quotient obtained by dividing the viscosity at 25° C. at a rotation speed of 0.5 rpm by the viscosity at 25° C. at a rotation speed of 2.5 rpm of 3.5 to 4.5 and preferably 3.6 to 4.2. When the viscosity measured at 25° C. at the rotation speed of 2.5 rpm is smaller than 10 Pa·s or exceeds 30 Pa·s, there is the possibility that workability of the electrically conductive paste in coating becomes poor. When the quotient obtained by dividing the viscosity measured at 25° C. at the rotation speed of 0.5 rpm by the viscosity measured at 25° C. at the rotation speed of 2.5 rpm is smaller than 3.5 or exceeds 4.5, there is the possibility that workability of the electrically conductive paste in coating becomes poor.

It is preferable that the cured product obtained by heating the electrically conductive paste has a tensile modulus at 25° C. of 0.1 to 2.5 GPa and more preferably 0.3 to 2.0 GPa. The condition of the heating is not particularly limited. For example, the electrically conductive paste can be cured by keeping at 170° C. for 30 minutes. When the tensile modulus at 25° C. is 0.1 to 2.5 GPa, the excellent properties can be maintained without forming cleavage under a load, for example, under a high temperature and a high humidity or under cyclic cooling and heating. When the tensile modulus is smaller than 0.1 GPa, the adhesive strength decreases and there is the possibility that cleavage of the bonding portion takes place under a load, for example, under a high temperature and a high humidity or under cyclic cooling and heating and the thermal and electric conductivities decrease. When the tensile modulus exceeds 2.5 GPa, there is the possibility that slow cleavage of the bonding portion takes place due to the stress generated during the cyclic cooling and heating.

In the electrically conductive paste of the present invention, it is preferable that the amount of chloride ions extracted with pure water at 120° C. under 213 kPa for 5 hours is 50 μg or less and preferably 20 μg or less per 1 g of the cured product. When the amount of the extracted chloride ions exceeds 50 μg per 1 g of the cured product, there is the possibility that metals at the surface of the semiconductor element are corroded and reliability of the semiconductor deteriorates.

It is preferable that the thermosetting resin used in the present invention has a gel time at 170° C. of 60 seconds or shorter. When the gel time of the thermosetting resin at 170° C. is 60 seconds or shorter, the electrically conductive paste is rapidly curable. Therefore, in-line curing such as the hot plate curing can be conducted and productivity can be increased.

Where necessary, the electrically conductive paste of the present invention may further comprise additives such as silane coupling agents, titanate coupling agents, pigments, dyes, defoaming agents, surfactants and solvents. The process for producing the electrically conductive paste of the present invention is not particularly limited. For example, the components of the paste are preliminarily mixed together and a paste is prepared from the obtained mixture using a three roll mixer or the like. The resultant paste is then defoamed in vacuo.

As the process for producing a semiconductor device using the electrically conductive paste of the present invention, a conventional process can be used. For example, after a prescribed portion of a lead frame is dispense coated with the electrically conductive paste using a commercial die bonder, a chip is mounted and the paste is cured by heating on a hot plate. Then, the wire bonding is conducted and the semiconductor device is produced in accordance with the transfer molding using an epoxy resin.

To summarize the advantages of the present invention, the electrically conductive paste of the present invention has thermal and electric conductivities approximately the same as those of solder, shows little change in properties under a high temperature and a high humidity or under cyclic cooling and heating, exhibits excellent workability in coating and can be applied by using nozzles having a wide range of diameters. The semiconductor devices prepared by using the electrically conductive paste of the present invention has an excellent reliability and can be produced at a low cost.

EXAMPLES

The present invention will be described more specifically with reference to examples in the following. However, the present invention is not limited to the examples.

In Examples and Comparative Examples, the measurements and the evaluations were conducted in accordance with the following methods.

(1) Particle Size Distribution of Silver Powder

The particle size distribution of silver powder was measured by using an apparatus for measuring the particle size distribution by laser diffraction.

(2) Viscosity

The viscosity was measured by using an E-type viscometer (a 3° cone) at 25° C. at rotation speeds of 0.5 rpm and 2.5 rpm. The quotient obtained by dividing the viscosity measured at 0.5 rpm by the viscosity measured at 2.5 rpm will be referred to as the thixo index.

(3) Gel Time

The gel time was measured at 170° C. in accordance with the method of Japanese Industrial Standard K6901 4.8.

(4) Adhesive Strength

A silicon chip of 2×2 mm was mounted on a copper frame using an electrically conductive paste and the resultant combination was cured in an oven at 170° C. for 30 minutes. After the curing, the die shear strength was measured at 25° C. and 250° C. using an apparatus for measuring the mounting strength.

(5) Tensile Modulus

A Teflon sheet was coated with an electrically conductive paste and a coating layer having a width of 10 mm, a length of 150 mm and a thickness of 100 µm was prepared. After the coating layer was cured in an oven at 170° C. for 30 minutes, the stress-strain curve was obtained by the measurement with a test length of 100 mm at an elongation speed of 1 mm/minute at 25° C. and the tensile modulus was calculated from the initial slope of the curve.

(6) Amount of Extracted Chloride Ions

A Teflon sheet was coated with an electrically conductive paste. After the coating layer was cured in an oven at 170° C. for 30 minutes, the cured resin was pulverized into fine powder by a vibration mill. From the obtained fine powder of the cured resin, about 2 g of a sample was taken and accurately weighed. To the sample, 20 ml of pure water was added and the sample was treated by the extraction at 120° C. under 213 kPa for 5 hours and the liquid obtained by the extraction was filtered. The amount of chloride ions was measured in accordance with the ion chromatography and converted into the amount per 1 g of the cured product.

(7) Thermal Conductivity

An electrically conductive paste was cured and a sample having a thickness of about 1 mm was prepared. The thermal diffusivity was obtained by using LF/TCM FA8510B manufactured by RIGAKU DENKI Co., Ltd. in accordance with the laser flash method. The thermal conductivity was obtained from the obtained result in combination with the values of the specific heat and the density.

(8) Volume Resistivity

A cured sample of an electrically conductive paste having a thickness of about 40 µm and a width of 4 mm was prepared. The resistance was measured at positions placed at 40 mm intervals by a tester and the volume resistivity was obtained from the sectional area of the sample.

(9) Reliability in a Humid Condition

A simulated element prepared by disposing aluminum wiring on the surface of a silicon chip was mounted on a lead frame of a 16 pin dual inline package (DIP) using an electrically conductive paste and the obtained combination was cured in an oven at 170° C. for 30 minutes. The cured product was treated by the gold wire bonding. The resultant product was treated by the transfer molding using an epoxy molding compound [manufactured by SUMITOMO BAKELITE Co., Ltd.; EME-6600CS] at 175° C. for 2 minutes and cured at 175° C. for 4 hours. After the obtained package was subjected to the pressure cooker treatment at 125° C. under 253 kPa for 500 hours, the fraction of open defective was obtained.

(10) Change in Resistance

A simulated element prepared by disposing aluminum wiring on the surface of a silicon chip was mounted on a lead frame of a 16 pin dual inline package (DIP) using an electrically conductive paste. After a circuit was formed with an electrically conductive paste between bonding pads, the obtained combination was cured in an oven at 170° C. for 30 minutes. After the transfer molding and the post curing were conducted in accordance with the same procedures as those conducted in the test of the reliability in a humid condition, the initial resistance of the paste was measured. The resistance was measured again after cooling at −65° C. for 30 minutes and, then, heating at 150° C. for 30 minutes were repeated 300 times. The change in resistance was obtained from these results.

(11) Dispensing Property

Using nozzles having an inner diameter of 0.1 mm in a pressurized automatic dispenser, 1,000 dots were formed and the number of dots formed without clogging of the nozzles was counted.

The particle size distributions and the positions of the peaks in the distribution of powders used in Examples and Comparative Examples are shown in Table 1.

TABLE 1

| | Silver powder (% by weight) | | | | |
|---|---|---|---|---|---|
| | a1 | a2 | a3 | a4 | a5 |
| Range of particle size | | | | | |
| smaller than 0.5 µm | 10.5 | 11.7 | 9.0 | 10.7 | 12.7 |
| 0.5 to 1.0 µm | 25.8 | 26.4 | 26.6 | 27.2 | 30.2 |
| 1.0 to 2.0 µm | 22.3 | 22.1 | 20.8 | 23.2 | 22.6 |
| 2.0 to 4.0 µm | 10.7 | 9.5 | 11.8 | 12.6 | 10.2 |
| 4.0 to 7.0 µm | 12.1 | 11.7 | 12.6 | 12.1 | 9.2 |
| 7.0 to 10 µm | 10.8 | 11.8 | 10.3 | 11.3 | 9.1 |
| 10 to 15 µm | 4.2 | 5.1 | 5.7 | 2.9 | 2.6 |
| 15 to 20 µm | 2.8 | 1.5 | 3.1 | 0 | 2.2 |
| 20 µm or larger | 0.8 | 0.2 | 0.1 | 0 | 1.2 |
| Position of peak (µm) | | | | | |
| sharp | 0.7 | 1.1 | 0.6 | 1.3 | 1.4 |
| broad | 5.2 | 8.6 | 5.3 | none | none |

Example 1

An epoxy resin of the bisphenol F type [the viscosity: 5,000 mPa·s; the epoxy equivalent: 170] in an amount of 18.2 parts by weight, 9.8 parts by weight of t-butylphenyl glycidyl ether [the viscosity: 400 mPa·s], 1.0 parts by weight of bisphenol F, 0.3 parts by weight of dicyandiamide and 0.7 parts by weight of 2-phenyl-4-methyl-5-hydroxymethylimidoazole were mixed together. To the resultant mixture, 130 parts by weight of silver powder a1 was added and mixed using a three-roll mill. The obtained mixture was defoamed in a vacuum chamber under 267 Pa for 30 minutes and an electrically conductive paste was obtained.

The obtained electrically conductive paste had a viscosity of 54 Pa·s measured at the rotation speed of 0.5 rpm, a viscosity of 15 Pa·s measured at the rotation speed of 2.5 rpm and a thixo index of 3.6. The gel time at 170° C. was 50 seconds. The adhesive strength of a chip was 39 N or greater at 25° C. and 14.7 N at 250° C. The tensile modulus was 1.7 GPa. The amount of extracted chloride ions was 8 □g per 1 g of the cured product. The thermal conductivity was 3.6 W/m·° C. The volume resistivity was $1.1 \times 10^{-4}$ □·cm. No defects were found in the test of the reliability in a humid condition. The change in resistance was 2.1%. In the test of the dispensing property, no clogging of nozzles was found.

Example 2 to 8

In accordance with the same procedures as those conducted in Example 1 using the compositions shown in Table 2, 7 types of electrically conductive pastes were examined and evaluated.

Comparative Example 1

In accordance with the same procedures as those conducted in Example 1 except that silver powder a5 was used in place of silver powder a1, an electrically conductive paste was prepared and evaluated.

The obtained electrically conductive paste had a viscosity of 118 Pa·s measured at the rotation speed of 0.5 rpm, a viscosity of 32 Pa·s measured at the rotation speed of 2.5 rpm and a thixo index of 3.7. The gel time at 170° C. was 55 seconds. The adhesive strength of a chip was 39 N or greater at 25° C. and 15.7 N at 250° C. The tensile modulus was 2.1 GPa. The amount of extracted chloride ions was 12 μg per 1 g of the cured product. The thermal conductivity was 3.2 W/m·° C. The volume resistivity was $2.4 \times 10^{-4}$ Ω·cm. No defects were found in the test of the reliability in a humid condition. The change in resistance was 1.3%. In the test of the dispensing property, 700 dots could be formed without clogging among 1,000 attempted dot formations.

Comparative Example 2 to 7

In accordance with the same procedures as those conducted in Example 1 using the compositions shown in Table 4, 6 types of electrically conductive pastes were examined and evaluated.

The formulations of the compositions in Examples 1 to 8 are shown Table 2 and the results of evaluation of these compositions are shown in Table 3. The formulations of the compositions in Comparative Examples 1 to 7 are shown in Table 4 and the results of evaluation of these compositions are shown in Table 5.

TABLE 2

| Formulation of composition (part by weight) | Example | | | | | | | |
|---|---|---|---|---|---|---|---|---|
| | 1 | 2 | 3 | 4 | 5 | 6 | 7 | 8 |
| epoxy resin of BPF type | 18.2 | 18.2 | 18.2 | 18.2 | — | — | — | 1.8 |
| epoxy resin of BPA type | — | — | — | — | — | — | — | — |
| t-BuPhGE | 9.8 | 5.0 | 8.8 | 9.8 | — | — | — | 1.0 |
| bisphenol F | 1.0 | 4.8 | 1.0 | 1.0 | — | — | — | 0.1 |
| dicyandiamide | 0.3 | 0.4 | 0.3 | 0.3 | — | — | — | 0.03 |
| 2P4MHZ | 0.7 | 0.8 | 0.7 | 0.7 | — | — | — | 0.07 |
| BAC-45 | — | — | — | — | 8.4 | 7.4 | 8.4 | 6.9 |
| E-1800 | — | — | 1.0 | — | 8.4 | 7.4 | 8.4 | 6.9 |
| Lauryl acrylate | — | — | — | — | 12.6 | 14.6 | 12.6 | 12.6 |
| PERHEXA 3M | — | — | — | — | 0.6 | 0.6 | 0.6 | 0.6 |
| silver powder a1 | 130 | — | — | 140 | 140 | — | — | 130 |
| silver powder a2 | — | 130 | — | — | — | 140 | — | — |
| silver powder a3 | — | — | 130 | — | — | — | 150 | — |
| silver powder a4 | — | — | — | — | — | — | — | — |
| silver powder a5 | — | — | — | — | — | — | — | — |

TABLE 3

| | Example | | | | | | | |
|---|---|---|---|---|---|---|---|---|
| | 1 | 2 | 3 | 4 | 5 | 6 | 7 | 8 |
| Viscosity, 0.5 rpm (Pa · s) | 54 | 76 | 78 | 90 | 68 | 96 | 107 | 95 |
| Viscosity, 2.5 rpm (Pa · s) | 15 | 20 | 21 | 23 | 18 | 24 | 26 | 25 |
| Thixo index | 3.6 | 3.8 | 3.7 | 3.9 | 3.8 | 4.0 | 4.1 | 3.8 |
| Gel time (second) | 50 | 55 | 55 | 50 | 15 | 13 | 20 | 10 |
| Adhesive strength (N/chip) | | | | | | | | |
| 25° C. | >39 | >39 | >39 | >39 | >39 | >39 | >39 | >39 |
| 250° C. | 14.7 | 13.5 | 20.3 | 16.7 | 13.7 | 13.3 | 16.2 | 16.6 |
| Tensile modulus (GPa) | 1.7 | 1.9 | 1.2 | 1.5 | 0.8 | 0.6 | 1.0 | 0.3 |
| Amount of extracted chloride ions (μg) | 8 | 12 | 5 | 7 | 10 | 7 | 8 | 11 |
| Thermal conductivity (W/m · ° C.) | 3.6 | 3.4 | 3.2 | 4.0 | 4.1 | 3.7 | 4.2 | 2.8 |
| Volume resistivity (Ω · cm) | $1.1 \times 10^{-4}$ | $8.2 \times 10^{-5}$ | $1.6 \times 10^{-4}$ | $8.6 \times 10^{-5}$ | $1.0 \times 10^{-4}$ | $2.2 \times 10^{-4}$ | $8.0 \times 10^{-5}$ | $2.6 \times 10^{-4}$ |
| Fraction defective in reliability test in humid condition (%) | 0 | 0 | 0 | 0 | 0 | 0 | 0 | 0 |

TABLE 3-continued

| | Example | | | | | | | |
|---|---|---|---|---|---|---|---|---|
| | 1 | 2 | 3 | 4 | 5 | 6 | 7 | 8 |
| Change in resistance (%) | 2.1 | 1.8 | 1.0 | 0.5 | 0.8 | 1.2 | 1.7 | 0.4 |
| Dispensing property | 1000 | 1000 | 1000 | 1000 | 1000 | 1000 | 1000 | 1000 |

TABLE 4

| Formulation of composition | Comparative Example | | | | | | |
|---|---|---|---|---|---|---|---|
| (part by weight) | 1 | 2 | 3 | 4 | 5 | 6 | 7 |
| epoxy resin of BPF type | 18.2 | — | 18.2 | 18.2 | — | — | — |
| epoxy resin of BPA type | — | 18.2 | — | — | — | — | — |
| t-BuPhGE | 9.8 | 9.8 | 9.8 | 9.8 | — | — | — |
| bisphenol F | 1.0 | 1.0 | 1.0 | 1.0 | — | — | — |
| dicyandiamide | 0.3 | 0.3 | 0.3 | 0.3 | — | — | — |
| 2P4MHZ | 0.7 | 0.7 | 0.7 | 0.7 | — | — | — |
| BAC-45 | — | — | — | — | 8.4 | 7.4 | 8.4 |
| E-1800 | — | — | — | — | 8.4 | 7.4 | 8.4 |
| Lauryl acrylate | — | — | — | — | 12.6 | 14.6 | 12.6 |
| PERHEXA 3M | — | — | — | — | 0.6 | 0.6 | 0.6 |
| silver powder a1 | — | — | 150 | — | 70 | — | — |
| silver powder a2 | — | — | — | — | — | — | — |
| silver powder a3 | — | — | — | — | — | — | — |
| silver powder a4 | — | 130 | — | 140 | — | — | — |
| silver powder a5 | 130 | — | — | — | — | 140 | 130 |

In Examples 1 to 8, electrically conductive pastes which had the thermal and electric conductivities as excellent as those of solder and exhibited only small changes in the properties under a high temperature and a high humidity and under cyclic cooling and heating and excellent workability of coating could be obtained. In contrast, in Comparative Example 1 in which the viscosity measured at the rotation speed of 2.5 rpm was higher, the dispensing property was inferior. In Comparative Example 2 in which the particle size distribution had a single peak, the concentration of chloride ions was lower and the reliability in a humid condition was inferior. In Comparative Example 3 in which the modulus was higher, the change in resistance was higher. Moreover, clogging of nozzles took place due to the higher viscosity and the dispensing property was inferior. In Comparative Example 4 in which the particle size distribution of silver powder a4 had a single peak alone, the dispensing property was inferior. In Comparative Example 5 in which the content of the silver powder in the paste was smaller, the viscosity was lower and the paste overflowed dropwise out of the nozzle during dispensing. In Comparative Example 6 in which the cured product of the paste had a higher modulus, the resistance was markedly higher. Moreover, the viscosity was higher and the dispensing property was mark-

TABLE 5

| | Comparative Example | | | | | | |
|---|---|---|---|---|---|---|---|
| | 1 | 2 | 3 | 4 | 5 | 6 | 7 |
| Viscosity, 0.5 rpm (Pa · s) | 118 | 84 | 133 | 81 | 34 | 179 | 122 |
| Viscosity, 2.5 rpm (Pa · s) | 32 | 21 | 38 | 22 | 8 | 56 | 32 |
| Thixo index | 3.7 | 4.0 | 3.5 | 3.7 | 4.2 | 3.2 | 3.8 |
| Gel time (second) | 55 | 50 | 50 | 51 | 18 | 20 | 15 |
| Adhesive strength (N/chip) | | | | | | | |
| 25° C. | >39 | >39 | >39 | >39 | >39 | >39 | >39 |
| 250° C. | 15.7 | 11.8 | 10.8 | 11.8 | 7.8 | 5.9 | 11.8 |
| Tensile modulus (GPa) | 2.1 | 2.2 | 2.6 | 1.9 | 0.3 | 3.2 | 0.9 |
| Amount of extracted chloride ions ($\mu$g) | 12 | 120 | 8 | 10 | 10 | 12 | 8 |
| Thermal conductivity (W/m · ° C.) | 3.2 | 2.8 | 4.0 | 4.2 | 0.2 | 3.4 | 2.7 |
| Volume resistivity ($\Omega$ · cm) | $2.4 \times 10^{-4}$ | $2.6 \times 10^{-4}$ | $9.2 \times 10^{-5}$ | $1.3 \times 10^{-4}$ | $2.1 \times 10^{-2}$ | $1.4 \times 10^{-4}$ | $23 \times 10^{-5}$ |
| Fraction defective in reliability test in humid condition (%) | 0 | 100 | 0 | 0 | 0 | 0 | 0 |
| Change in resistance (%) | 1.3 | 2.8 | 5.0 | 1.0 | 3.2 | 250 | 1.7 |
| Dispensing property | 700 | 800 | 620 | 490 | * | 28 | 810 |

Notes to the Tables:
Epoxy resin of BPF type: an epoxy resin of the bisphenol F type; the viscosity: 5,000 mPa · s; the epoxy equivalent: 170.
Epoxy resin of BPA type: an epoxy resin of the bisphenol A type; the viscosity: 6,800 mPa · s; the epoxy equivalent: 190.
t-BuPhGE: t-butylphenyl glycidyl ether: the viscosity: 4,000 mPa · s; a reactive diluent.
Bisphenol F: a phenolic curing agent.
dicyandiamide: a latent curing agent.
2P4MHZ: 2-phenyl-4-methyl-5-hydroxymethylimidazole; an imidazole compound.
BAC-45: liquid polybutadiene having acrylates at the chain ends; manufactured by OSAKA YUKI KAGAKU KOGYO Co., Ltd.
E-1800: polybutadiene modified with epoxy group; manufactured by NISSEKI MITSUBISHI Co., Ltd.
Lauryl acrylate: lauryl ester of acrylic acid.
PERHEXA 3M: 1,1-bis(t-butylperoxy)-3, 3,5-trimethylcyclohexane.
*: fluid overflow.

edly inferior. In Comparative Example 7 in which silver powder a5 having a single peak in the particle size distribution was used, clogging of the nozzles took place and the dispensing property was inferior.

What is claimed is:

1. An electrically conductive paste which comprises (A) silver powder and (B) a thermosetting resin, wherein a content of the silver powder in the paste is 80% by weight or more, a particle size distribution of the silver powder measured by an apparatus for measuring a particle size distribution by laser diffraction has one peak between 0.5 to 2 μm and another peak between 2 to 10 μm, viscosity of the paste measured by an E-type viscometer is 35 to 135 Pa·s at 25° C. at a rotation speed of 0.5 rpm and 10 to 30 Pa·s at 25° C. at a rotation speed of 2.5 rpm, a quotient obtained by dividing the viscosity at 25° C. at a rotation speed of 0.5 rpm by the viscosity at 25° C. at a rotation speed of 2.5 rpm is 3.5 to 4.5, and a cured product obtained by heating the paste has a tensile modulus of 0.1 to 2.5 GPa at 25° C.

2. A paste according to claim 1, wherein the particle size distribution of the silver powder is:

| | |
|---|---|
| particles smaller than 0.5 μm: | 8 to 12% by weight |
| 0.5 to 1.0 μm: | 24 to 28% by weight |
| 1.0 to 2.0 μm: | 20 to 24% by weight |
| 2.0 to 4.0 μm: | 9 to 13% by weight |
| 4.0 to 7.0 μm: | 10 to 14% by weight |
| 7.0 to 10 μm: | 9 to 13% by weight |
| 10 to 15 μm: | 2 to 6% by weight |
| 15 to 20 μm: | 1 to 4% by weight |
| 20 μm or larger: | 0 to 2% by weight. |

3. A paste according to claim 1, wherein the thermosetting resin is at least one resin selected from epoxy resins which are liquid at 25° C., acrylate compounds having an unsaturated double bond and methacrylate compounds having an unsaturated double bond.

4. A paste according to claim 1, wherein an amount of chloride ions extracted from the cured product with pure water at 120° C. under 213 kPa for 5 hours is 50 μg or less per 1 g of the cured product.

5. A paste according to claim 1, wherein a gel time of the thermosetting resin at 170° C. is 60 seconds or shorter.

6. A semiconductor device prepared by using an electrically conductive paste described in claim 1.

7. A semiconductor device prepared by using an electrically conductive paste described in claim 2.

8. A semiconductor device prepared by using an electrically conductive paste described in claim 3.

9. A semiconductor device prepared by using an electrically conductive paste described in claim 4.

10. A semiconductor device prepared by using an electrically conductive paste described in claim 5.

11. A process for preparing the semiconductor device of claim 6 comprising the following steps:

coating a portion of a frame with the electrically conductive paste;

mounting a chip on the frame; and curing the electrically conductive paste.

* * * * *